(12) United States Patent
Yamamoto et al.

(10) Patent No.: US 6,263,036 B1
(45) Date of Patent: Jul. 17, 2001

(54) ASYNCHRONOUS SIGNAL INPUT APPARATUS AND SAMPLING FREQUENCY CONVERSION APPARATUS

(75) Inventors: Yusuke Yamamoto; Ichiro Futohashi; Yasuyuki Muraki, all of Hamamatsu (JP)

(73) Assignee: Yamaha Corporation, Shizuoka-ken (JP)

( * ) Notice: Subject to any disclaimer, the term of this patent is extended or adjusted under 35 U.S.C. 154(b) by 0 days.

(21) Appl. No.: 09/124,752

(22) Filed: Jul. 29, 1998

(30) Foreign Application Priority Data

Jul. 30, 1997 (JP) ................................... 9-204920
Jul. 31, 1997 (JP) ................................... 9-206352

(51) Int. Cl.$^7$ .................................................. H04L 25/00
(52) U.S. Cl. ................................. 375/372; 375/106
(58) Field of Search ................................. 375/372, 106

(56) References Cited

U.S. PATENT DOCUMENTS

| | | | | |
|---|---|---|---|---|
| 4,453,259 | * | 6/1984 | Miller ................................... | 375/106 |
| 4,912,549 | * | 3/1990 | Altman et al. ......................... | 358/17 |
| 5,331,346 | * | 7/1994 | Sheilds et al. ......................... | 348/441 |
| 5,351,087 | * | 9/1994 | Christopher et al. ................. | 548/441 |
| 5,555,030 | * | 9/1996 | Takamoto et al. ................... | 348/642 |
| 6,061,410 | * | 5/2000 | Linz ..................................... | 375/355 |

FOREIGN PATENT DOCUMENTS 6-54323   7/1994   (JP) .

OTHER PUBLICATIONS

Ronald W. Schafer and Laurence R. Rabiner. "A Digital Processing Approach to Interpolation" IEEE, vol. 61, No. 6 Jun. 1973, pp. 692–702.*

* cited by examiner

Primary Examiner—Stephen Chin
Assistant Examiner—Tony Al-Beshrawi
(74) Attorney, Agent, or Firm—Reed Smith Hazel & Thomas LLP

(57) ABSTRACT

An asynchronous signal input apparatus includes a memory device which writes data that are input at a predetermined frequency, in response to a write signal, and reads data in response to a read signal. A data quantity measuring device measures a data quantity representing a quantity of data stored in the memory device. A read signal generating device generates the read signal at a frequency that varies depending upon the measured data quantity. A sampling frequency conversion apparatus comprises the memory device, data quantity measuring device, and read signal generating device employed in the asynchronous signal input apparatus. Further, the read signal generating device includes a converter which performs non-linear conversion on the data quantity measured by the data quantity measuring device. An interpolation information producing device produces interpolation information to be used for data generated from the memory device, based on the data quantity to which the non-linear gain is given by the converter. An interpolation device interpolates data that are read from the memory device in response to the read signal, based on the produced interpolation information.

12 Claims, 14 Drawing Sheets

PRIOR ART

| ΔS | Gain(ΔS) |
|----|----------|
| 0  | $-256/2^{15}$ |
| 1  | $-8/2^{15}$ |
| 2  | 0 |
| 3  | $+8/2^{15}$ |
| 4  | $+256/2^{15}$ |

ASYNCHRONOUS SIGNAL INPUT APPARATUS AND SAMPLING FREQUENCY CONVERSION APPARATUS

BACKGROUND OF THE INVENTION

1. Field of the Invention

The present invention relates to an asynchronous signal input apparatus which surely receives input signals or data of various sampling rates, and a sampling frequency conversion apparatus which converts input data of a certain sampling frequency into data of a different sampling frequency, and outputs the data thus converted.

2. Description of Related Art

In a known example of sampling frequency converter which receives an asynchronous input signal and converts it into a signal of a certain sampling frequency, data are sequentially written into a memory called FIFO each time a data write command PUSH is supplied, and data that have been stored are read from the FIFO each time a data read command POP is supplied. FIG. 1 shows the construction of such a sampling frequency converter using FIFO.

In order to store data in the FIFO shown in FIG. 1, data is supplied to an input terminal In of the FIFO 1, and a command PUSH is supplied at the same time. Upon receipt of the command PUSH, a W counter 2 produces a write address that designates a location in the FIFO 1, and the write address is supplied to a write address input terminal WAdd of the FIFO 1. In the meantime, the command PUSH serving as a write enable signal WE is supplied to the FIFO 1. As a result, the input data is stored at the location in the FIFO 1 designated by the write address supplied thereto. This input operation under the command PUSH may be carried out at a sampling frequency of 44.1 kHz, for example.

In order to read data from the FIFO, on the other hand, a command POP is supplied. Then, an R counter 3 produces a read address that designates a location in the FIFO 1, and the read address thus produced is supplied to a read address input terminal RAdd of the FIFO 1. In the meantime, the command POP serving as a read enable signal RE is supplied to the FIFO 1. As a result, data stored at the read address is generated from the FIFO 1. This output operation under the command POP may be carried out at a sampling frequency of 48 kHz, for example.

A state monitor unit 4 monitors counter values (addresses) of the W counter 2 and R counter 3, and sends out a control signal to an AND circuit 5 to make the command POP effective or non-effective, so as to hold the read address so that the read address does not exceed the write address. When a command POP is made non-effective, a read enable signal RE is given to the FIFO 1 while the value of the R counter is being maintained or unchanged, so that the same data as that read upon receipt of the last command POP is repeatedly read from the FIFO 1. Thus, the sampling frequency converter of FIG. 1 is constructed so as to repeatedly read the same data while holding the read address, so that the sampling frequency can be increased. If the sampling frequency is to be lowered, however, some sets of the data stored in the FIFO 1 need to be skipped while they are being read.

FIG. 2 shows the construction of a sampling frequency conversion circuit disclosed in Japanese Laid-Open Utility Model Publication (Kokai) No. 6 54323. The sampling frequency conversion circuit shown in FIG. 2 is adapted to convert input data Din into data Dout having a different sampling frequency from that of the input data Din. In the sampling frequency conversion circuit, data Din is subjected to linear interpolation based on a master clock CKM and a clock CKout received from the outside of the circuit, using time difference information representing a difference between sampling points of data Din and sampling points of data Dout. This example shows a method of converting sampling frequency without using FIFO, for reference.

In the known sampling frequency converter (FIG. 1) using the FIFO as described above, the sampling frequency of the input data is somewhat shifted from that of the output data, and therefore the FIFO 1 may become empty or full during a long-time operation. In view of such situations, the state monitor unit 4 controls the read address so as to continuously output the same data in a hold mode, or skip a part of the data. FIG. 3 shows waveforms of input and output signals (data) received or generated by the known sampling frequency converter. As shown in FIG. 3, in the known sampling frequency converter using the FIFO, the output signal (indicated by a dotted line) is deformed (causing occurrence of noises) as compared with the input signal (indicated by a solid line).

In the meantime, the sampling frequency converter (FIG. 2) using the time difference information merely performs linear interpolation, and thus suffers from low interpolation accuracy.

As a developed form of the apparatus of FIG. 2 for improving the interpolation accuracy, a method of combining oversampling and linear interpolation as shown in FIG. 4 may be considered. In the method using oversampling in addition to linear interpolation, when data of a new sampling point X is calculated through linear interpolation, data of oversampling points A, B adjacent to the new sampling point X are used, instead of data of old sampling points indicated by circles, as shown in FIG. 6, thus achieving high accuracy of interpolation.

FIG. 5 schematically illustrates the method of combining oversampling and linear interpolation. The upper part of FIG. 5 shows an arrangement in which an octuple oversampling operation is performed based on four sets of sampling data, and the lower part shows an arrangement in which linear interpolation is performed based on two oversampling values calculated in the upper part. In the upper part of FIG. 5, symbols D1, D2, D3, D4 each denote a single-sample delay unit, which transfers input data to the later stage in response to a sampling clock (44.1 kHz in this example). With regard to coefficients $C_{ij}$ (i=1–4, j=0–7), subscript "i" represents a coefficient to be given to data from the delay unit Di, namely, a coefficient by which the data Di is multiplied, and subscript "j" represents a coefficient for calculating a value of a j-th oversampling point. Namely, data of the j-th oversampling point is calculated using four coefficients having the same j value. Also, data of eight oversampling points are calculated using a total of eight sets of coefficients where each set consists of four coefficients having the same j value. Based on the data of two oversampling points thus calculated, a linear interpolation block in the lower part calculates data representative of a certain position between the two oversampling points, through linear interpolation. Thus, the calculation of two oversampling values and the linear interpolation are performed at a frequency corresponding to a new sampling frequency (48 kHz in this example), to thus enable highly accurate sampling frequency conversion.

In the sampling frequency converter of FIG. 5 as described above, highly accurate calculations are needed for oversampling, and further, two-step operations are required for calculating oversampling values A, B so as to obtain an interpolated value X between the two points. Furthermore, a hardware to perform operations for linear interpolation is also required. Thus, the known sampling frequency converter requires an increased time of operations, and a large-sized hardware, resulting in an increase in the cost.

SUMMARY OF THE INVENTION

It is a first object of the invention to provide an asynchronous signal input apparatus which automatically operates in response to a sampling frequency of input signals or data, so as to receive various asynchronous signals or data without fail.

A second object of the invention is to provide a sampling frequency conversion apparatus which is capable of generating output signals or data that are free from noise, which correspond to various asynchronous input signals or data.

A third object of the invention is to provide a sampling frequency conversion apparatus which is capable of performing high-speed operations without using a large-sized hardware.

To attain the first object, according to a first aspect of the invention, there is provided an asynchronous signal input apparatus comprising a memory device which writes data that are input at a predetermined frequency, in response to a write signal, and reads data in response to a read signal, a data quantity measuring device which measures a data quantity representing a quantity of data stored in the memory device, and a read signal generating device which generates the read signal at a frequency that varies depending upon the data quantity measured by the data quantity measuring device.

Preferably, the read signal generating device includes a converter which performs non-linear conversion on the data quantity measured by the data quantity measuring device, so as to give a non-linear gain to the data quantity, the read signal generating device generating the read signal at a frequency that varies depending upon the data quantity to which the non-linear gain is given by the converter.

More preferably, the non-linear gain is determined such that the frequency at which the read signal is generated is kept at a predetermined level when the data quantity is equal to an appropriate value, and the frequency is corrected by an amount of correction which increases non-linearly as a difference between the data quantity and the appropriate value increases, in a direction in which the data quantity becomes equal to the appropriate value.

In a preferred form of the first aspect, the data amount measuring device comprises a counter which increments a count value thereof upon receipt of each pulse of the write signal, and decrements the count value upon receipt of each pulse of the read signal, so as to output the count value which represents the data quantity stored in the memory device.

To attain the second object, according to a second asepct of the invention, there is provided a sampling frequency conversion apparatus comprising a memory device which writes data that are input at a predetermined frequency, in response to a write signal, and reads data in response to a read signal, a data quantity measuring device which measures a data quantity representing a quantity of data stored in the memory device, a read signal generating device which generates the read signal at a frequency that varies depending upon the data quantity measured by the data quantity measuring device, the read signal generating device including a converter which performs non-linear conversion on the data quantity measured by the data quantity measuring device, an interpolation information producing device which produces interpolation information to be used for data generated from the memory device, based on the data quantity to which the non-linear gain is given by the converter, and an interpolation device which interpolates data that are read from the memory device in response to the read signal generated by the read signal generating device, based on the interpolation information produced by the interpolation information producing device.

Preferably, the interpolation device interpolates the data read from the memory device in response to the read signal, upon each occurrence of a predetermined sampling signal, such that when the read signal is generated upon occurrence of the sampling signal, interpolation of data that is newly read from the memory device is performed based on the data newly read and the interpolation information, and when the read signal is not generated upon occurrence of the sampling signal, interpolation of data previously read from the memory device upon previous occurrence of the read signal is performed based on the data previously read and the interpolation information.

With the above arrangements according to the first and second aspects of the invention, in reading data from the memory device at a predetermined frequency, the data quantity measuring devices measures a data quantity representing a quantity of data stored in the memory device, and the read signal generating device generates a read signal for reading data from the memory devvice, at a frequency that varies depending upon the measured data quantity measured by the data quantity measuring device. As a result, the asynchronous signal input apparatus can automatically operate in response to the sampling frequency of input signals or data, so as to receive various asynchronous signals or data without fail, and the sampling frequency conversion apparatus can generate output signals or data that are free from noise, which correspond to various asynchronous input signals or data.

To attain the third object, according to a third aspect of the invention, there is provided a sampling frequency conversion apparatus comprising a first interpolation ratio producing device which produces a first interpolation ratio used for obtaining an interpolation point between input data received in response to a first clock, a coefficient producing device which produces a pair of coefficients for obtaining a pair of oversampling points, based on the first interpolation ratio, a second interpolation ratio producing device which produces a second interpolation ratio at an interpolation point between the pair of oversampling points, based on the first interpolation ratio, an interpolation device which performs linear interpolation on the pair of coefficients produced by the coefficient producing device, so as to obtain a value of the interpolation point between the pair of oversampling points, based on the second interpolation ratio produced by the second interpolation ratio producing device, and an operation device which performs convolution of the value of the interpolation point obtained through linear interpolation by the interpolation device and the input data, in response to a second clock, and generates a result of the convolution as output data.

Prefereably, the coefficient producing device includes a memory device which stores a plurality of pairs of coefficients corresponding to the first interpolation ratio.

More preferably, the coefficient producing device obtains a first coefficient address that designates one of the pair of coefficients based on the first interpolation ratio, and obtains a second coefficient address by adding a predetermined integer to the first coefficient address, the coefficient producing device reading the pair of coefficients from the memory device, based on the obtained first coefficient address and second coefficient address.

In a first variation of the third aspect, the coefficient producing device comprises a first memory device which stores coefficients for calculating even- numbered oversampling points, out of a plurality of pairs of coefficients each of which provide the pair of coefficients, and a second memory device which stores coefficients for calculating odd-numbered oversampling points, out of the plurality of pairs of coefficients, wherein the pair of coefficients are read from the first memory device and the second memory device, based on the first interpolation ratio.

In the third aspect, the operation device includes a plurality of delay devices that delay the input data by different delay amounts to output a plurality of delay data, respectively, a plurality of multipliers of the same number as the delay devices, which multiply the plurality of delay data by the value of the interpolation point obtained through linear interpolation by the interpolation device, and an adder which adds results of multiplication generated from the multipliers. In a second variation of the third aspect, the operation device includes a plurality of delay devices that delay the input data by different delay amounts to output a plurality of delay data, respectively, a plurality of first adders which amount to one half of the number of the delay devices, each of the the first adders adding a given pair of delay data selected from the plurality of delay data, a plurality of multipliers which amount to one half of the number of the delay devices, which multiply addition data from the first adders by the value of the interpolation point obtained through linear interpolation by the interpolation device, and a second adder which adds results of multiplication generated from the multipliers.

In a third variation of the third aspect, the coefficient producing device includes a memory device which stores a plurality of pairs of coefficients that are compressed by a power of 2.

In a preferred form of the third variation, the coefficient producing device comprises a first memory device which stores coefficients for calculating even- numbered oversampling points selected from the plurality of pairs of coefficients and compressed by the power of 2, a second memory device which stores coefficients for calculating odd-numbered oversampling points selected from the plurality of pairs of coefficients and compressed by the power of 2, the sampling frequency conversion apparatus further comprising, a switching device which switches between a coefficient read from the first memory device and a coefficient read from the second memory device, a first shift device which shifts one of the coefficient read from the first memory device and the coefficient read from the second memory device, and a second shift device which shifts a result of convolution obtained by the operation device.

With the above arrangements according to the third aspect of the invention, the first interpolation ratio producing device produces the first interpolation ratio used for obtaining the interpolation point between input data received in response to the first clock. The coefficient producing device produces a pair of coefficients for obtaining a pair of oversampling points, based on the first interpolation ratio. The second interpolation ratio producing device produces the second interpolation ratio at an interpolation point between the pair of oversampling points, based on the first interpolation ratio. The interpolation device performs linear interpolation on the pair of coefficients produced by the coefficient producing device, so as to obtain a value of the interpolation point between the pair of oversampling points, based on the second interpolation ratio produced by the second interpolation ratio producing device. The operation device performs convolution of the value of the interpolation point obtained through linear interpolation by the interpolation device and the input data, in response to the second clock, and generates a result of the convolution as output data. As a result, the sampling frequency conversion apparatus can be implemented without using a large-sized hardware and hence have a reduced amount of calculations, to thereby enable performing high-speed operations for sampling frequency conversion.

The above and other objects, features, and advantages of the invention will become more apparatus from the following detailed description taken in conjunction with the accompanying drawings.

DETAILED DESCRIPTION

The invention will be described with reference to the drawings showing some preferred embodiments thereof.

Figure 7:
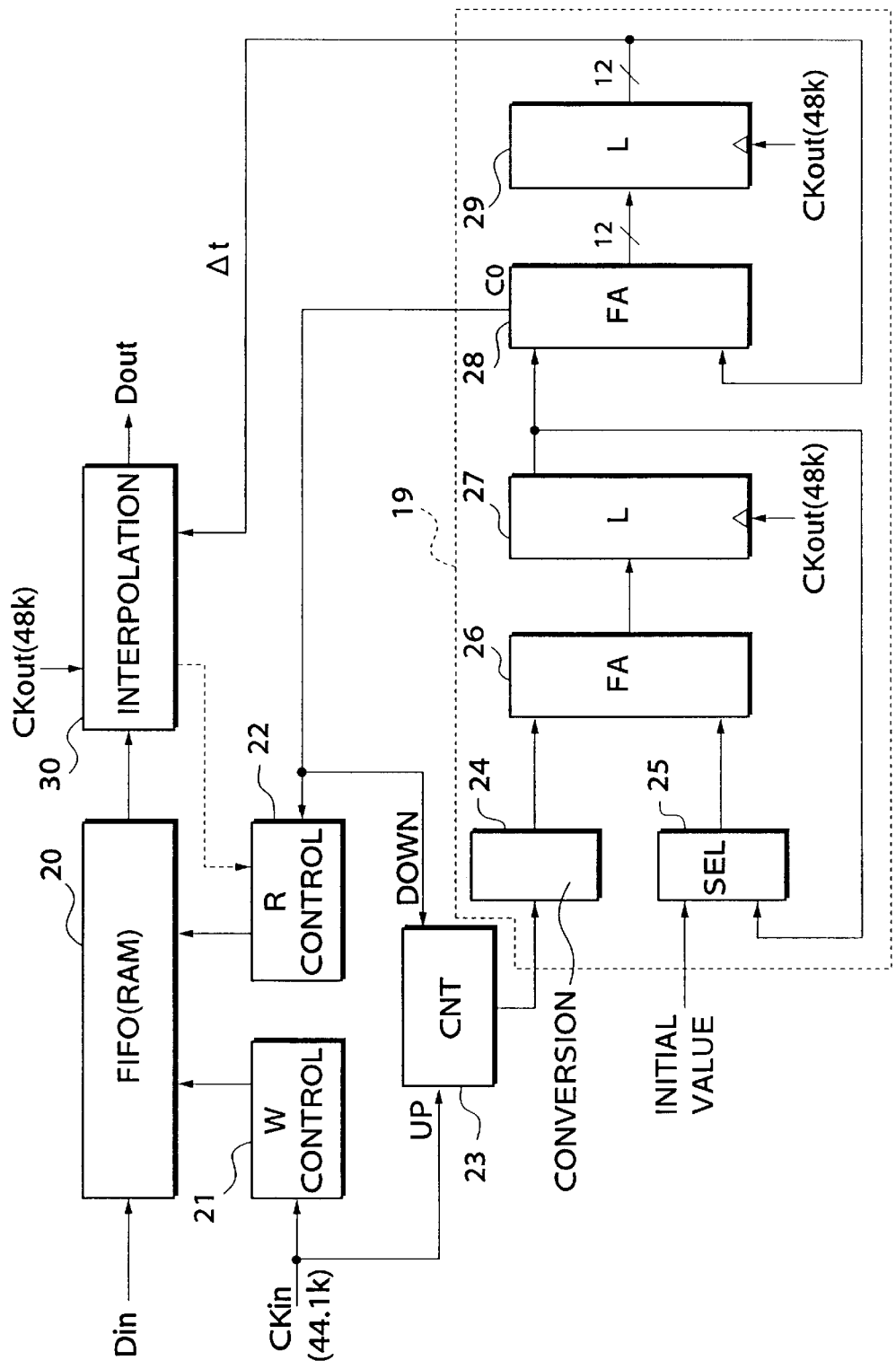
FIG. 7 is a block diagram showing the construction of a sampling frequency conversion apparatus according to a first embodiment of the present invention.

FIG. 7 shows the basic construction of a sampling frequency conversion apparatus according to a first embodiment of the invention, which receives an asynchronous input signal and converts it into a signal of a predetermined sampling frequency. In FIG. 7, a FIFO 20 is formed of a dual port RAM (random access memory). The FIFO 20 stores input data Din according to a write address and a write enable signal supplied from a write controller 21 that will be described later, and generates stored data to an interpolation circuit 30, according to a read address and a read enable signal supplied from a read controller 22 that will be described later.

The write controller 21 produces the write address and write enable signal in response to a write timing signal CKin (clock) (44.1 kHz), and supplies them to the FIFO 20. The read controller 22 produces the read address and read enable signal in response to a read timing signal CO supplied from a full adder 28 that will be described later.

Figures 9, 10:
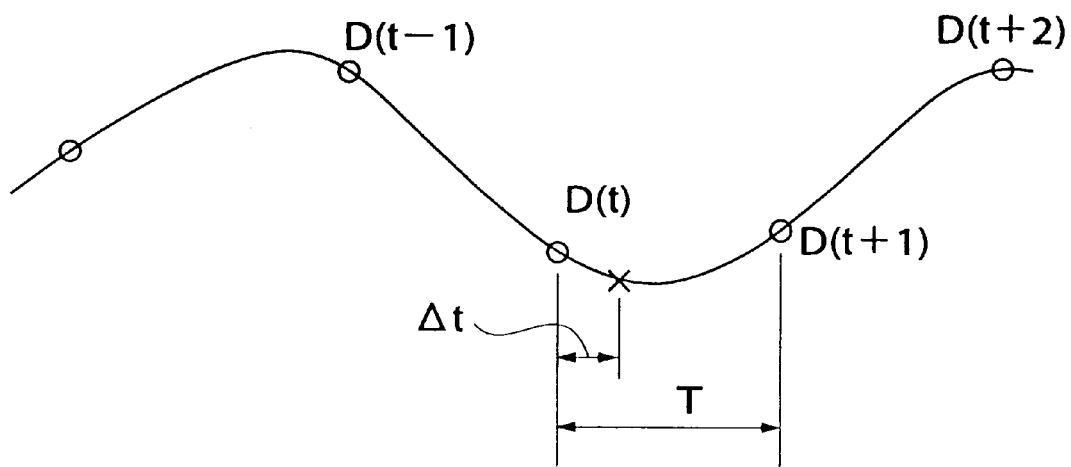
FIG. 9 is a schematic view showing the relationship between data quantity $\Delta S$ of FIFO and gain Gain($\Delta S$)
FIG. 10 is a schematic view useful in explaining the operation of an interpolation circuit in FIG. 7.

A counter 23 serves to monitor the quantity or amount of data stored in the FIFO 20. The counter 23 increments its counter value upon receipt of a pulse of the write timing signal CKin, and decrements the counter value upon receipt of a pulse of the read timing signal CO, to thereby provide the current quantity $\Delta S$ of data stored in the FIFO 20. In FIG. 7, reference numeral 19 denotes a PLL (phase-locked loop), wherein a converter 24 is adapted to perform non-linear conversion on the current data quantity $\Delta S$ represented by the counter value of the counter 23, so as to output data Gain($\Delta S$) to which a non-linear gain is given, and the data Gain ($\Delta S$) thus obtained is supplied to a full adder 26. FIG. 9 shows a table of conversion characteristics of the converter 24. The full adder 26 functions to add the data Gain ($\Delta S$) to the output of a selector circuit 25 that will be described later. If y(n) represents a value supplied from the selector circuit 25, the full adder 26 performs addition that is expressed as y(n+1)=y(n)+Gain($\Delta S$), to output a value y(n+1).

The selector circuit 25, which serves to supply the above-indicated value y(n) to the full adder 26, selects the initial value y(0) upon start of the operation, and thereafter selects an output y(n) of a latch circuit 27. Here, the initial value y(0) is set to a value that enables conversion of the frequency from 44.1 kHz to 48 kHz. In the present embodiment, the initial value y(0) is obtained by multiplying 4096 by (44.1/48), i.e., y(0)=4096×(44.1/48). Since the purpose of providing the initial value is to reduce the time it takes until the operation is stabilized, it is not essential to the invention. The full adder 26 supplies the value y (n+1) obtained according to the above expression, to the latch circuit 27. The latch circuit 27 latches the result of addition of the full adder 26, in synchronization with a clock CKout (48 kHz) received from an external device, and supplies the latched signal to the selector circuit 25 in a feedback manner, while supplying the same to the full adder 28.

The full adder 28 adds the value supplied from the latch circuit 27 and a value supplied (in a feedback manner) from a latch circuit 29 that will be described later, and supplies the result of addition or sum to the latch circuit 29, while supplying a carry that provides a read timing signal CO, to the read controller 22 and counter 23 described above. The latch circuit 29 latches the above result of addition in synchronization with the clock CKout (48 kHz) received from the external device, and supplies the value to the full adder 28, while supplying the same value that provides an interpolation ratio At, to the interpolation circuit 30 that will be described later.

The FIFO 20 through the latch circuit 29 described above constitute an asynchronous signal input apparatus according to the invention. The sampling frequency conversion apparatus of the invention including the interpolation circuit 30 will be described later.

Figure 8:
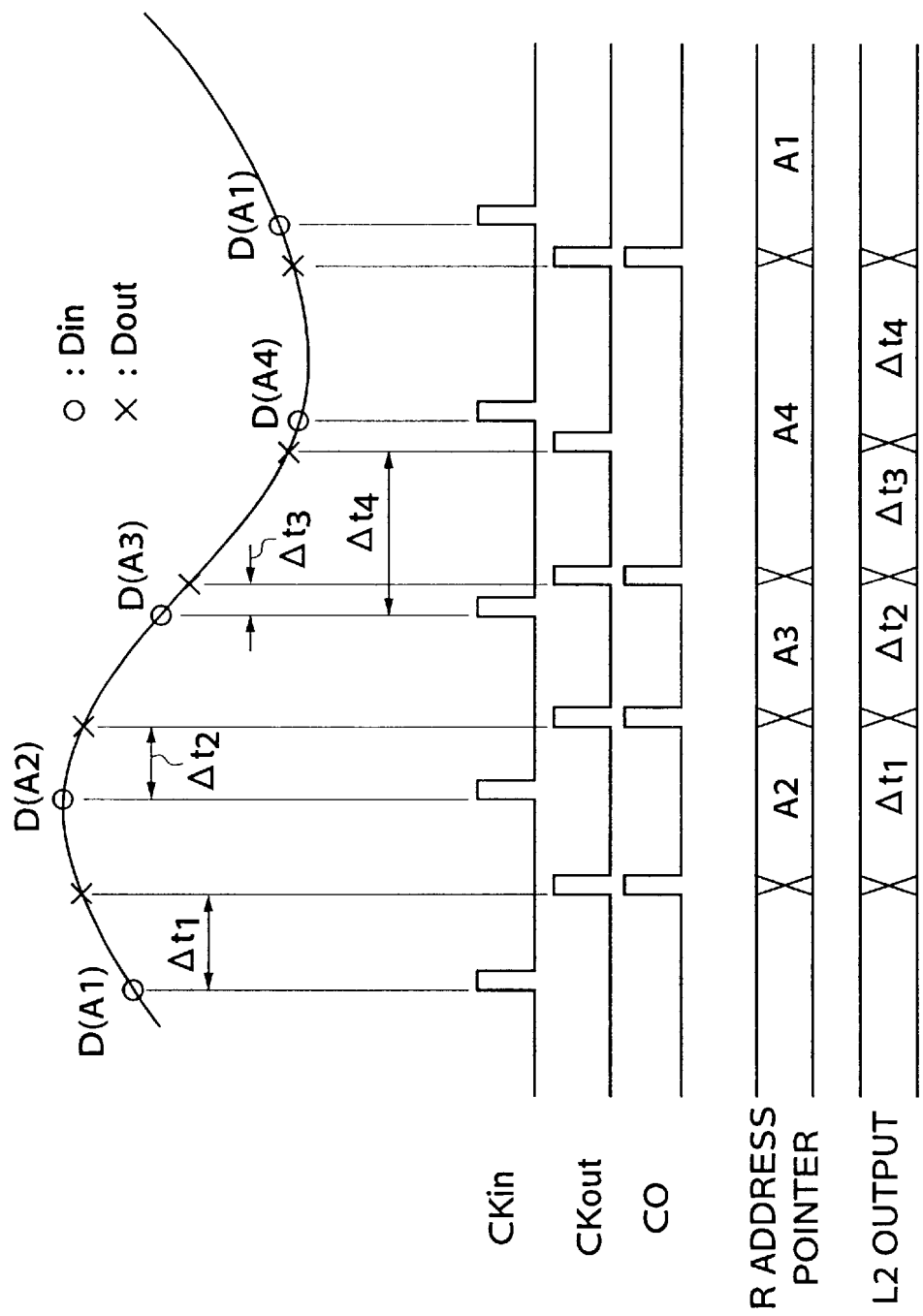
FIG. 8 is a timing chart useful in explaining the operation of the first embodiment.

The operation of the asynchronous signal input apparatus constructed as described above according to the first embodiment will be now described. FIG. 8 is a timing chart useful in explaining the operation of the input apparatus. The asynchronous signal input apparatus as a whole is constructed so that a synchronizing operation is performed on input data Din received by the FIFO 20, based on the clock CKin operating at 44.1 kHz and the clock CKout operating at 48 kHz. Namely, the input apparatus produces pulses that provide the read timing signal CO to be supplied to the read controller 22, by removing or eliminating some of the pulses of the 48 kHz clock CKout, as shown in FIG. 8. By producing the read timing signal CO synchronized with the input data and supplying it to the read controller 22 of the FIFO 20, the input apparatus is able to surely receive the input data.

An accumulator formed of the full adder 28 that generates carries to provide the read timing signal CO and the latch circuit 29 is constructed on the basis of 12 bits. If the value equal to 2$^{12}$=4096 is given, for example, the full adder 28 generates a carry CO upon occurrence of each pulse of the 48 kHz clock. Namely, when the value of 4096 is supplied from the latch circuit 27 of the previous stage, the full adder 28 operates to supply the pulses of the 48 kHz clock CKout as they are, to the read controller 22. If a value smaller than 4096, for example, the above-indicated initial value 4096× (44.1/48) is given, the full adder 28 does not generate a carry CO upon occurrence of each pulse of the 48 kHz clock. Namely, the pulses of the read timing signal CO generated by the full adder 28 generally correspond to those of the 48 kHz clock CKout, but some pulses of the clock CKout are removed or eliminated from the read timing signal CO, as shown in FIG. 8.

The counter 23 through the latch circuit 27 cooperate to produce a numerical value used for determining the timing of occurrence of carries by the full adder 28. The converter 24 generates data Gain ($\Delta S$) of a gain that always maintains the data quantity $\Delta S$ at an appropriate value (two in the present embodiment as shown in FIG. 9), based on the data quantity $\Delta S$ of the FIFO 20 indicated by the counter 23. Namely, when the data quantity $\Delta S$ is smaller than the appropriate value, the converter 24 operates to generate a relatively small value (negative value), so as to reduce the frequency of occurrence of the read timing signal CO. If the data quantity $\Delta S$ is larger than the appropriate value, on the other hand, the converter 24 operates to generate a relatively large value (positive value), so as to increase the frequency of occurrence of the read timing signal CO. If the data quantity ΔS is equal to the appropriate value (2), the converter 24 generates value "0". The relationship between ΔS and Gain(ΔS) is a non-linear relationship as shown in the table of FIG. 9, for the following reason: the amount of correction is increased with an increase in the degree of deviation of the data quantity from its target value, so that the data quantity comes to coincide with the target value in a short time, and the amount of correction is reduced if the data quantity is kept sufficiently close to the target value, so as to enable stable operations. The full adder 26 adds the output of the converter 24 and the output of the selector circuit 25. Namely, the output of the full adder 26 starts with the initial value 4096×(44.1/48) generated by the selector circuit 25, and then increases and decreases in accordance with the data quantity AS of the FIFO 20 supplied from the counter 23. The output of the full adder 26 is latched by the latch circuit 27, based on the clock CKout (48 kHz).

The asynchronous signal input apparatus as a whole operates in the manner as described above, so as to perform a synchronizing operation on the input data Din received by the FIFO 20, based on the 44.1 kHz clock CKin and the 48 kHz clock CKout.

Next, the sampling frequency conversion apparatus will be described which is a combination of the asynchronous signal input apparatus comprised of the FIFO 20 through the latch circuit 29, and the interpolation circuit 30. As described above, data supplied from the FIFO 20 are generated in accordance with the pulses of the read timing signal CO obtained by eliminating some of the pulses of the clock CKout (48 kHz). The interpolation circuit 30 functions to convert the output into a signal having an accurate sampling frequency of 48 kHz, and generate the converted signal as data Dout.

Before the interpolation circuit 30 is described in greater detail, the principle of interpolation will be described with reference to FIG. 10. In FIG. 10, values of interpolation points each represented by mark "X" can be calculated from input sample values each represented by mark "○" through either linear interpolation or high order interpolation, if Δt, T, and input sample value D are known. In the linear interpolation, for example, the values of the interpolation points may be obtained by computing {D(t+1)−D(t)}×(Δt/T)+D(t).

Referring back to FIG. 7, input sample values D are supplied from the FIFO 20, and the interpolation ratio Δt is given by the latch circuit 29. Time T is set to a fixed value, i.e., 4096, and the output data Dout are calculated according to the above-indicated formula of linear interpolation, or a formula of high order interpolation, on the basis of the sample values D, Δt, and T.

As described above, since the read timing signal CO generated from the full adder 28 has pulses obtained by eliminating or removing some pulses from the clock CKout (48 kHz), the data is not generated from the FIFO 20 upon occurrence of every pulse of the 48 kHz clock. On the other hand, information relating to interpolation, namely, interpolation ratio Δt, is updated upon occurrence of every pulse of the clock CKout (48 kHz). This arrangement provides an important effect in performing desirable interpolation. This will be described with reference to FIG. 8.

In FIG. 8, D(A1), D(A2), . . . represent a sequence of input data written into respective addresses A1, A2, . . . of the FIFO 20, in response to pulses of the 44.1 kHz clock CKin.

The data stored in the FIFO 20 are read out according to values (indicated by R address pointers in FIG. 8) in the read controller 22 that counts the pulses of the read timing signal Co. The interpolation ratio Δt is generated from the latch circuit 29 upon occurrence of every pulse of the clock CKout (48 kHz). Namely, at the time when a pulse of the signal CO is generated, interpolation is performed based on updated data D and updated interpolation ratio Δt. When a pulse of the clock CKout occurs while no pulse of the signal CO is generated, interpolation is performed based on the last data D that has been received, and updated interpolation ratio Δt, whereby reasonable interpolation processing is performed as shown in FIG. 8.

The control of addresses of the FIFO 20 and production of interpolation ratio Δt for performing the interpolation as described above are not exclusively needed for the purpose of accomplishing the interpolation processing, but are essential functions to be performed by the asynchronous signal input apparatus comprised of elements ranging from the FIFO 20 to the latch circuit 29. Thus, the asynchronous signal input apparatus of the present invention is particularly advantageous when applied to the sampling frequency conversion apparatus.

Next, a second embodiment of the invention will be described.

Figure 11:
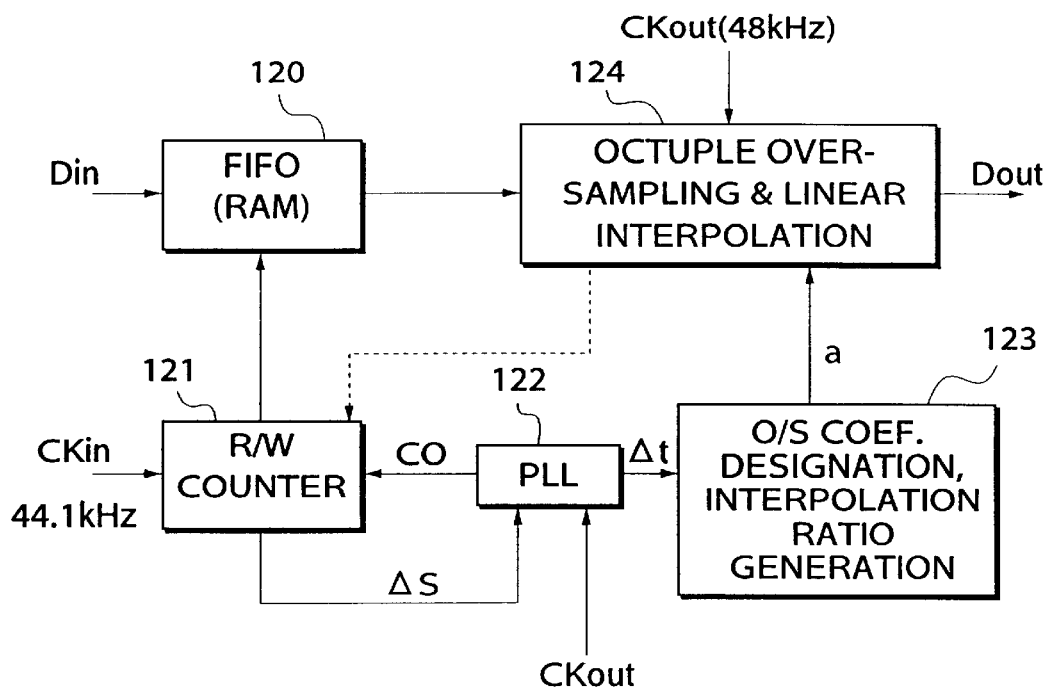
FIG. 11 is a block diagram showing the construction of a sampling frequency conversion apparatus according to a second embodiment of the present invention.

FIG. 11 shows the basic construction of a sampling frequency conversion apparatus according to the second embodiment. In FIG. 11, the apparatus includes a FIFO 120 which is formed of a dual port RAM (random access memory). The FIFO 120 stores input data Din at a location corresponding to a write address supplied from a read/write counter 121 which will be described later, and generates stored data from a location corresponding to a read address supplied from the read/write counter 121 and delivers the data to an octuple oversampling/linear interpolation circuit 124.

The read/write counter 121 produces a write enable signal and a write address in response to a write timing pulse CKin (44.1 kHz), and supplies them to the FIFO 120. The counter 121 also produces a read enable signal and a read address in response to a read timing signal CO supplied from a PLL 122 that will be described later, and supplies them to the FIFO 120. Also, the read/write counter 121 increments its counter value upon receipt of each write timing pulse CKin, and decrements its counter value upon receipt of each pulse of the read timing signal CO. Thus, the counter 121 detects data quantity ΔS that represents the quantity or amount of data stored in the FIFO 120, and supplies the value ΔS to the PLL 122.

Figure 12:
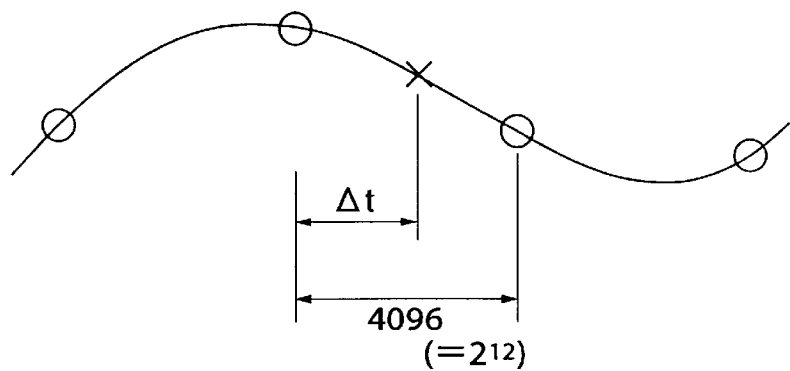
FIG. 12 is a schematic view useful in explaining a method of calculating an interpolation ratio At in PLL of the sampling frequency conversion apparatus of the second embodiment.

The PLL 122, which is comprised of full adders, latch circuits and others, produces the read timing signal CO according to the data quantity ΔS, on the basis of a clock CKout (48 kHz) received from an external device, and supplies the signal CO to the read/write counter 121. Also, the PLL 122 calculates an interpolation ratio Δt used for obtaining an interpolated value (interpolation point) (represented by "X") between adjacent sets of input data Din (represented by "○"), as shown in FIG. 12, and supplies the interpolation ratio Δt to an O/S (oversampling) coefficient designation/interpolation ratio producing block 123. The interpolation ratio Δt is a value obtained without taking oversampling into consideration.

The PLL 122 has the same arrangement as that of the first embodiment (including the components 24–29) shown in FIG. 7, and therefore will not be illustrated nor described in detail.

In the present embodiment, the full adder 28 (FIG. 7) of the PLL 122 supplies the result of addition of a value supplied from the latch circuit 27 (FIG. 7) and a value supplied from the latch circuit 29 (FIG. 7) in a feedback manner, to the latch circuit 29, and supplies a carry that provides the read timing signal CO to the above-described read/write counter 121. The latch circuit 29 latches the result of addition in synchronization with a clock CKout (48 kHz) received from an external device, and supplies the resulting signal that provides an interpolation ratio Δt to the O/S (oversampling) coefficient designation/interpolation ratio producing block 123, as well as to the full adder 28.

Figure 13:
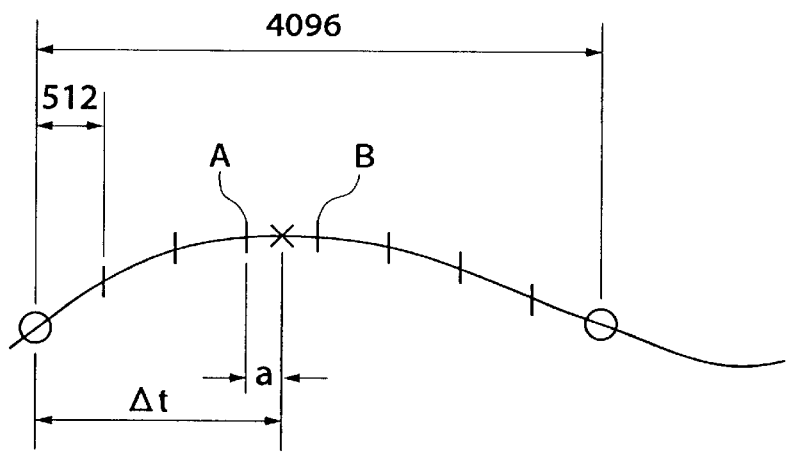
FIG. 13 is a schematic view useful in explaining a method of calculating an interpolation ratio a used for linear interpolation in an octuple oversampling/linear interpolation block.

The O/S (oversampling) coefficient determination/interpolation ratio production block 123 calculates, based on the interpolation ratio Δt, addresses COEA, COEB (actually, only COEA) that designate a pair of coefficients for obtaining oversampling points A, B, which are needed by an octuple oversampling/linear interpolation circuit 124 for obtaining a value of an interpolation point (X) as shown in FIG. 13. The O/S coefficient designation/interpolation ratio producing block 123 also calculates an interpolation ratio a taking account of oversampling, and supplies it to the octuple oversampling/linear interpolation circuit 124.

The coefficient addresses COEA, COEB are determined according to the following expressions.

$$COEA = Int(\Delta t/512)$$

$$COEB = COEA + 1$$

where Int(x) represents an operation that makes the decimals equal to "0" to provide an integer. The coefficient address COEA is an integer that is equal to or greater than 0 (0≦COEA), and the coefficient address COEB is an integer that is equal to or smaller than 7 (COEB≦7). The interpolation ratio a at the interpolation point X between adjacent oversampling points A, B can be calculated as a=Mod512 (Δt)/512, where Mod512(x) represents an operation for obtaining a residue when x is divided by 512.

The octuple oversampling/linear interpolation circuit 124 converts the sampling frequency of input data D1 according to the coefficient address COEA and the interpolation ratio a obtained taking account of oversampling, to generate data Dout, without executing two separate steps of oversampling and linear interpolation. Here, the process of oversampling and linear interpolation according to the present invention is represented by a mathematical expression as follows:

$$X = a(D1*C1j + D2*C2j + D3*C3j + D4*C4j) + b(D1*C1j+1) + D2*C2(j+1) + D3*C3(j+1) + D4*C4(j+1)).$$

This expression reduces to:

$$X = D1(aC1i + bC1(i+1)) + D2(aC2i + bC2(i+1)) + D3(aC3i + bC3(i+1)) + D4(aC4i + bC4(i+1)).$$

In the expression indicated just above, the expression in each pair of parentheses indicates that linear interpolation is performed between adjacent coefficients. By calculating a value from the expression in each pair of parentheses, and directly multiplying the value by data Di, therefore, the sampling frequency of the input data can be converted without executing the two separate steps described above, assuring the same accuracy as would be achieved by executing the two separate steps.

Figure 14:
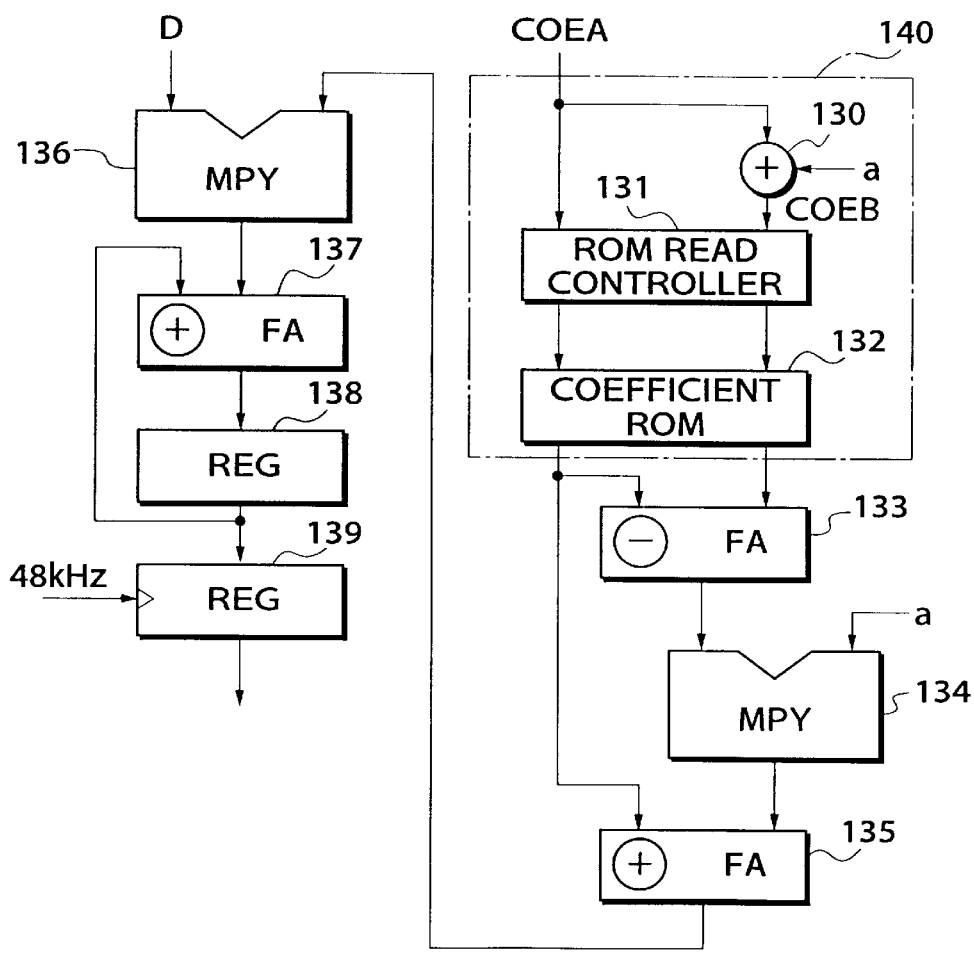
FIG. 14 is a block diagram showing an example of the construction of the octuple oversampling/linear interpolation block.

FIG. 14 shows one example of the construction of the octuple oversampling/linear interpolation circuit 124. In FIG. 14, the octuple oversampling/linear interpolation circuit 124 is comprised of a DSP (digital signal processor), and includes a coefficient interpolating portion shown in the right half of the figure, which performs linear interpolation between coefficients according to the principle described above, and a convolution operating portion shown in the left half of the figure.

Figure 15:
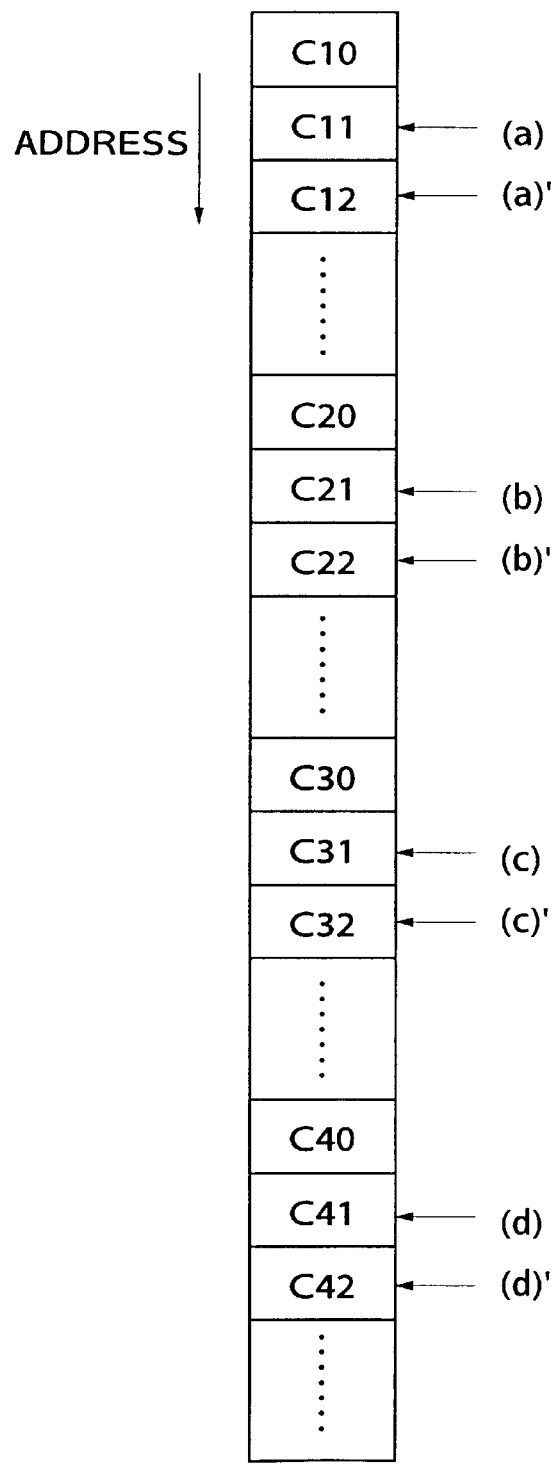
FIG. 15 is a schematic view useful in explaining coefficients stored in a coefficient ROM.

The coefficient interpolating portion is comprised of an adder 130, ROM read controller 131, coefficient ROM 132, full adder 133, multiplier 134, and full adder 135. The adder 130 calculates the coefficient address COEB by adding "1" to the coefficient address COEA that designates a pair of coefficients. The ROM read controller 131 reads the pair of coefficients from the coefficient ROM 132, according to the coefficient addresses COEA, COEB. At this time, the ROM read controller 131 controls the coefficient ROM 132 so that a coefficient Cij corresponding to the coefficient address COEA is supplied to one of input terminals of the adder 133, and a coefficient Ci(j+1) corresponding to the coefficient address COEB is supplied to the other input terminal (−) of the adder 133 and to one of input terminals (+) of the adder 135. As shown in FIG. 15, the coefficient ROM 132 stores a plurality of coefficients Cij (i=1–4, j=0–7) needed for oversampling, and a pair of coefficients Cij, Ci(j+1) designated by the ROM read controller 31 are output to the respective portions described above. The coefficient addresses COEA. COEB designate a pair of coefficients such that when COEA is one of the addresses (a)–(d) as shown in FIG. 15, COEB is a corresponding one of the adjacent addresses (a)'–(d)'.

Subsequently, the full adder 133 calculates a value of Cij−Ci(j+1), and supplies the result to the multiplier 134. The multiplier 134 multiplies the value of Cij−Ci(j+1) by the interpolation ratio a, to obtain a(Cij−Ci(j+1)), and supplies the result to the full adder 135. The full adder 135 calculates a value of Ci(j+1)+{a(Cij−Ci(j+1))}, and supplies the result to the multiplier 136. These operations described above are successively performed in first timing (i=1), second timing (i=2), third timing (i=3), and fourth timing (i=4).

The convolution operating portion is comprised of the multiplier 136, a full adder 137, a register 138 and a register 139. The multiplier 136 multiplies the result of calculation of the full adder 135, i.e., the value of Ci(j+1)+{a(Cij−Ci (j+1))}, by input data Di(i=1–4), and supplies the result of multiplication to one of input terminals of the full adder 137. The full adder 137 adds the above result, i.e., (Ci(j+1)+{a (Cij−Ci(j+1))})*Di and a value supplied from the register 138 that will be described later, and supplies the result of addition to the register 138. The register 138 holds the result of addition, and supplies it to the other input terminal of the full adder 137, while supplying the same result to the register 139. In this manner, the multiplier 136, full adder 137, and the register 138 perform accumulation (convolution) of the above-indicated values (Ci(j+1)+{a (Cij−Ci(j+1))})*Di which are sequentially supplied in the first to fourth timings as described above. The register 139 retrieves data from the register 138, in response to each pulse of a clock (48 kHz) received from an external device, and finally outputs the data.

The operation of the second embodiment constructed as described above will be now explained. Initially, input data Din are stored in the FIFO 120 at locations corresponding to write addresses supplied from the read/write counter 121. The data Din stored in the FIFO 120 are read out from locations corresponding to read addresses supplied from the read/write counter 121, and then supplied to the octuple oversampling/linear interpolation circuit 124. The timing of reading data from the FIFO 120 is controlled based on the data quantity ΔS, by the read/write counter 121 and the PLL 122, so that the data quantity of the FIFO 120 becomes equal to an appropriate value in the same manner as in the first embodiment described above.

The PLL 122 calculates the interpolation ratio Δt for obtaining an interpolation point (X) between adjacent input data Din (○) based on the above-indicated data quantity ΔS, as shown in FIG. 13, upon receipt of each pulse of a clock CKout (48 kHz) from the external device. The PLL 122 then supplies the interpolation ratio ΔS to the O/S coefficient designation/interpolation ratio producing block 123. The O/S coefficient designation/interpolation ratio producing block 123 then calculates, based on the interpolation ratio Δt, the coefficient address COEA for obtaining a pair of coefficients Cij, Ci(j+1) for determining oversampling points A, B needed by the octuple oversampling/linear interpolation circuit 124 for obtaining a value of an interpolation point (X) as shown in FIG. 13, and also calculates the interpolation ratio a taking account of oversampling.

Figure 1:
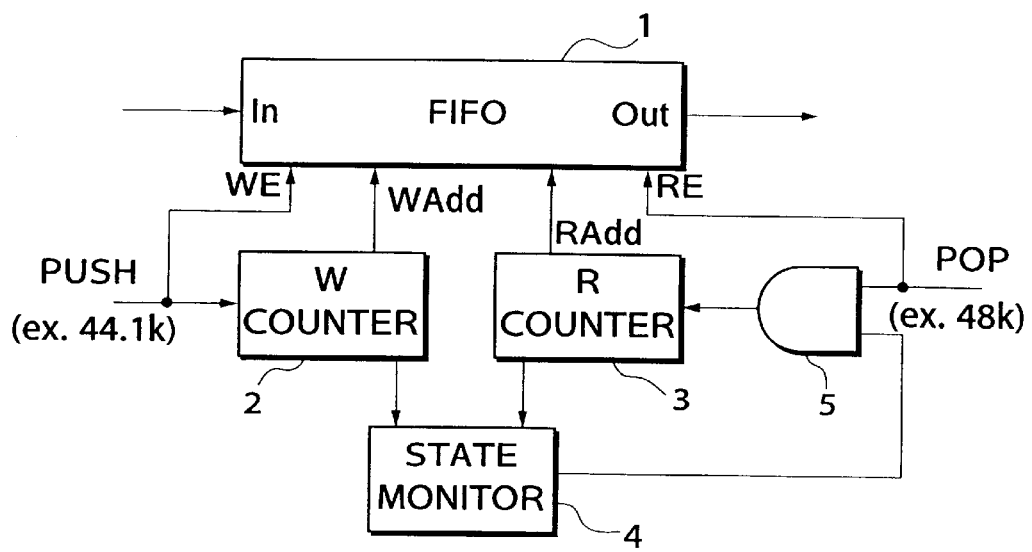
FIG. 1 is a block diagram showing the construction of a known sampling frequency converter which uses a FIFO.
Figure 2:
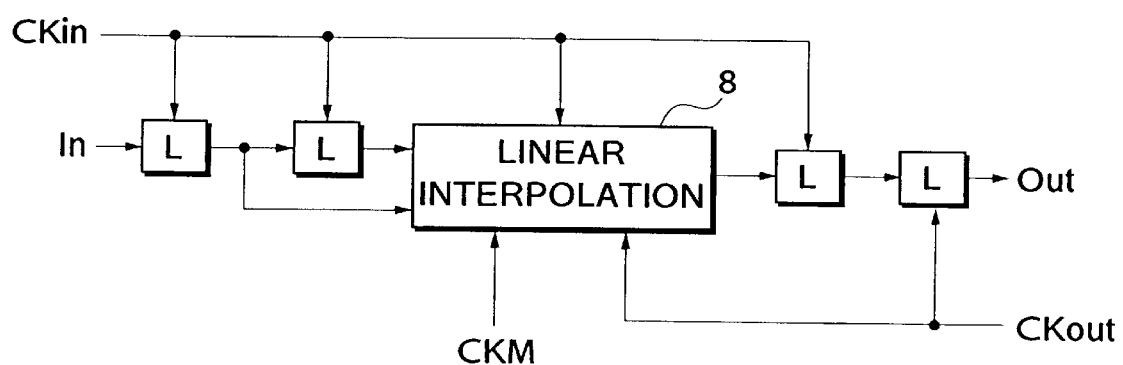
FIG. 2 is a block diagram showing a known sampling frequency converter which does not use a FIFO.
Figure 3:
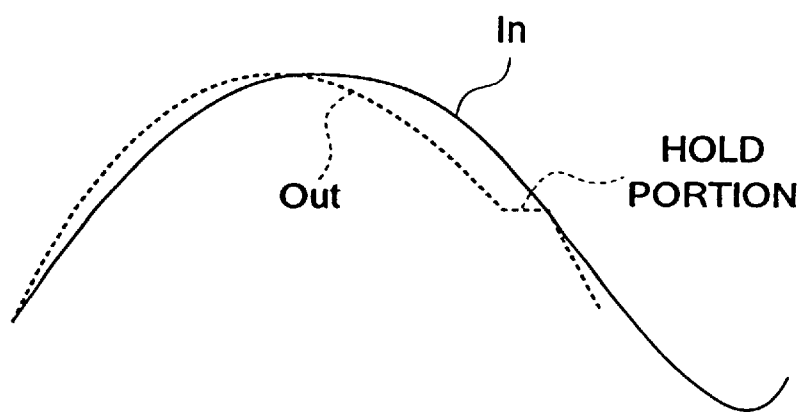
FIG. 3 is a schematic view showing waveforms of input and output signals of the known sampling frequency converter using the FIFO.
Figure 4:
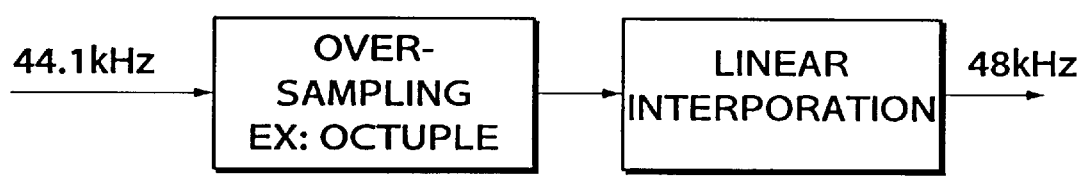
FIG. 4 is a block diagram showing the construction of another known sampling frequency converter.
Figure 5:
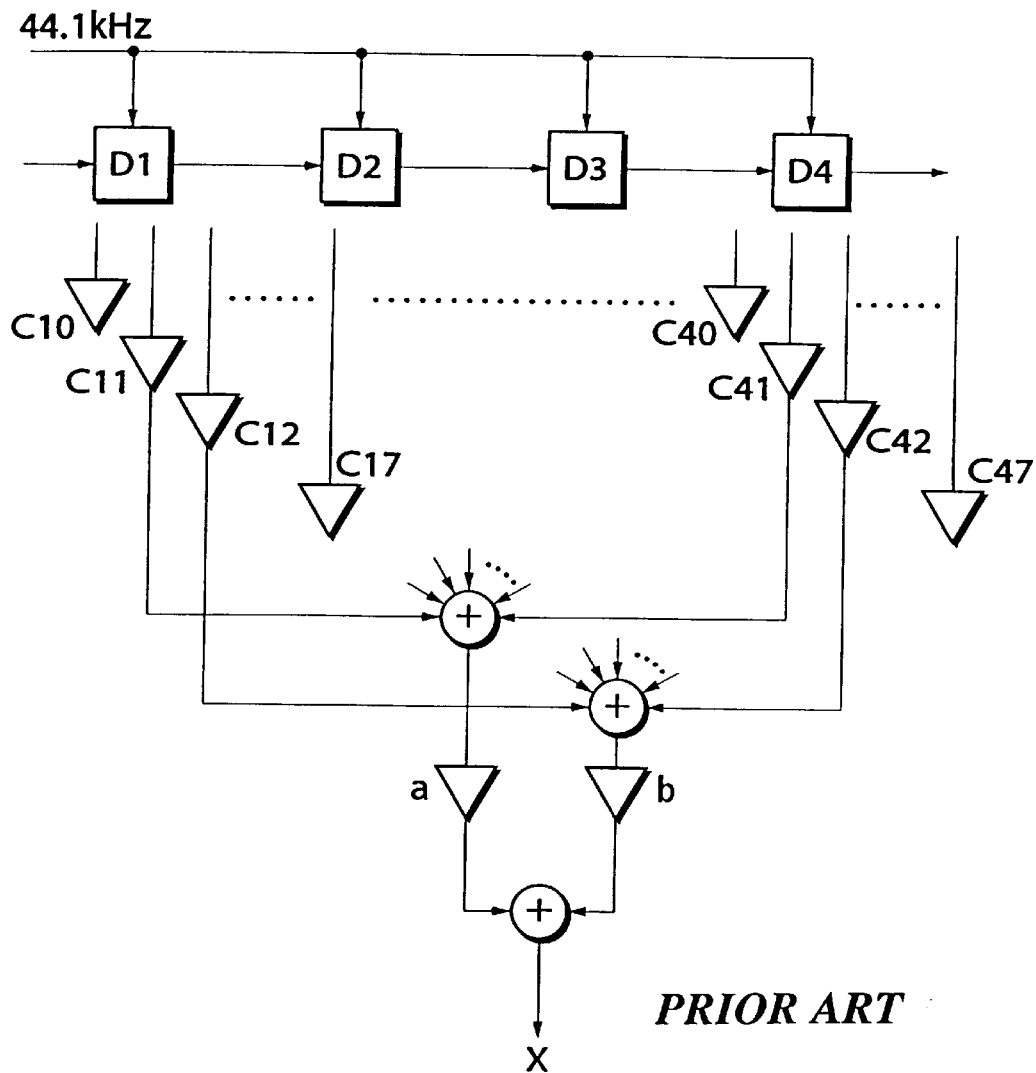
FIG. 5 is a block diagram showing an arrangement for performing oversampling and linear interpolation, using the sampling frequency converter of FIG. 4.
Figure 6:
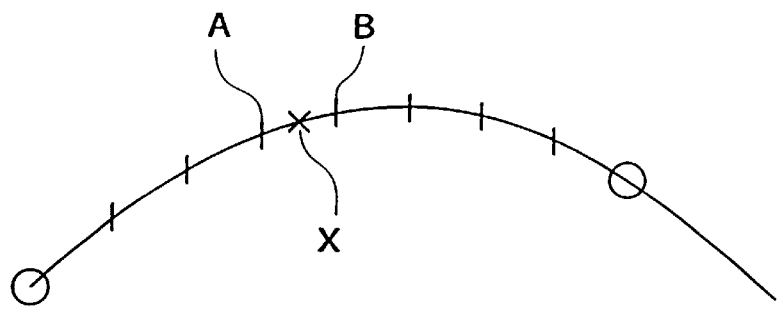
FIG. 6 is a schematic view useful in explaining the operation of the converter of FIG. 5 for performing oversampling and linear interpolation.

The octuple oversampling/linear interpolation circuit 124 calculates a first value represented by a·C1j+(1−a)·C1(j+1) in the first timing (i=1), a second value represented by a·C2j+(1−a)·C2(j+1) in the second timing (i=2), a third value represented by a·C3j+(1−a)·C3(j+1) in the third timing (i=3), and a fourth value represented by a·C4j+(1−a)·C4(j+1) in the fourth timing (i=4), and performs convolution on these values and data Di (i=1–4), so as to calculate a value represented by {a·C1j+(1−a)·C1(j+1)}·D1+{a·C2j+(1−a)·C2(j+1)}D2+{a·C3j+(1−a)·C3(j+1)}·D3+{a·C4j+(1−a)·C4(j+1)}·C4(j+1)}D4. This expression is equivalent to that used for obtaining an interpolated value X in the known arrangement as shown in FIG. 5.

In the above result obtained by the convolution described above, the expression within a pair of brackets in each term indicates that linear interpolation between adjacent coefficients is performed. By directly multiplying the result of this expression by data Di, the interpolated value X can be obtained without executing the two separate steps of oversampling and linear interpolation, assuring the same accuracy as would be achieved by the two separate steps. In other words, the conventional sampling frequency converter is required to perform (1) convolution for obtaining an octuple oversampling value A, (2) convolution for obtaining an octuple oversampling value B, and (3) an operation for implementing linear interpolation. On the other hand, the sampling frequency conversion apparatus of the present embodiment is only required to perform (1) an operation for implementing coefficient linear interpolation, and (2) convolution. Furthermore, sufficiently high accuracy can be achieved even if the size of the multiplier 134 for coefficient interpolation is smaller than that of the multiplier 136 for convolution, though it depends upon the required interpolation accuracy.

Figure 16:
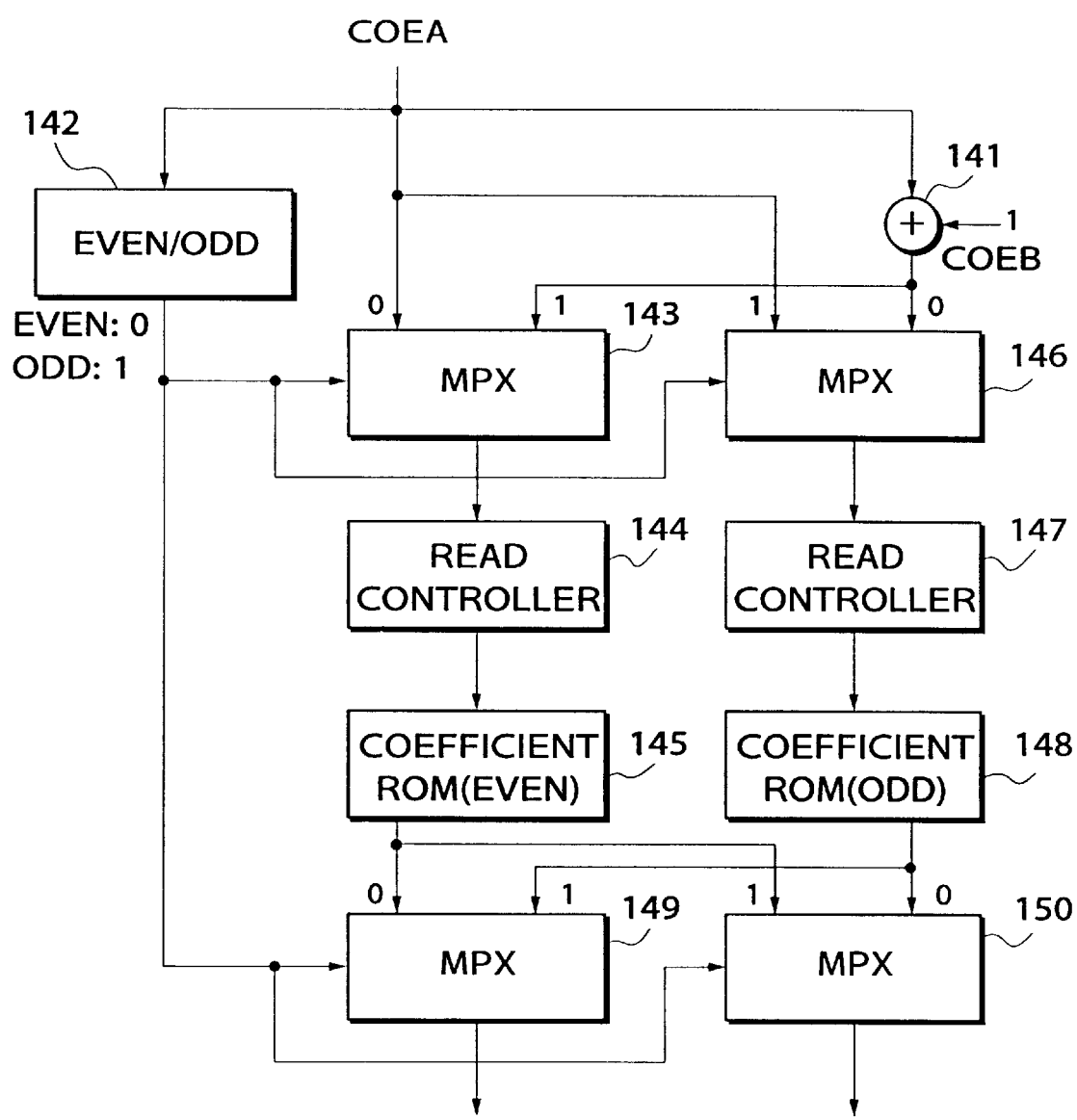
FIG. 16 is a block diagram showing the construction of a first variation of the second embodiment.

Next, a first variation of the second embodiment will be described. In the first variation, coefficients Cij stored in the coefficient ROM 132 are divided into a group for calculating odd-numbered oversampling points (hereinafter simply called "odd coefficients"), and a group for calculating even-numbered oversampling points (hereinafter simply called "even coefficients"), and they are stored in these groups, so as to achieve a high-speed operation. FIG. 16 shows the construction of a portion which replaces a block 140 including the ROM read controller 131 and the coefficient ROM 132 shown in FIG. 14. The other portions of the converter of this variation are identical with those of FIG. 14, description of which is therefore omitted. In FIG. 16, an adder 141 adds "1" to a coefficient address COEA that designates a pair of coefficients, so as to obtain a coefficient address COEB, which is then supplied to selector circuits 143, 146, described later. An odd/even discrimination block 142 supplies to the selector circuits 143, 146, and selector circuits 149, 150 a selection signal that determines which one of odd coefficient and even coefficient is to be generated, based on the above-indicated coefficient address COEA.

Figure 17:
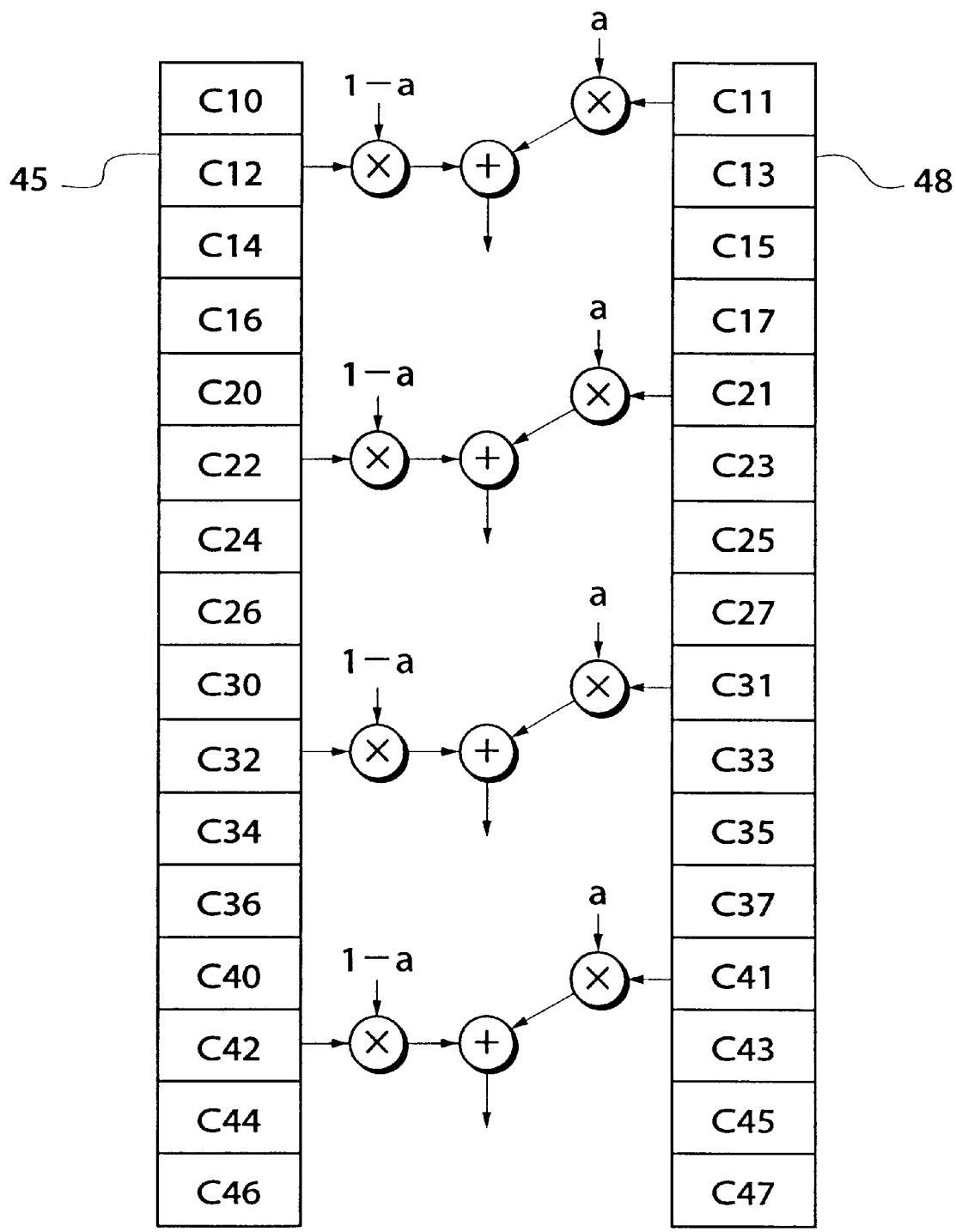
FIG. 17 is a schematic view useful in explaining coefficients stored in a coefficient ROM of the first variation.

The selector circuit 143 supplies the coefficient address COEA to a read controller 144 when the selection signal from the odd/even discrimination block 142 is "0" representing even number, and supplies the coefficient address COEB to the read controller 144 when the selection signal is "1" representing odd number. The read controller 144 reads out a coefficient from the coefficient ROM 145 that stores only even coefficients, depending upon which one of the coefficient addresses COEA, COEB for designating a pair of coefficients is received. The coefficient ROM 145 stores coefficients (C10, C12, C14, . . . , C46) for calculating even-numbered oversampling points, out of coefficients Cij (i=1–4, j=0–7) needed for oversampling, as shown in FIG. 17, and supplies the coefficient designated by the read controller 144 to the selector circuits 149, 150.

The selector circuit 146 supplies the coefficient address COEB to a read controller 147 when the selection signal from the odd/even discrimination block 142 is "0" (even number), and supplies the coefficient address COEA to the read controller 147 when the selection signal is "1" (odd number). The read controller 147 reads out a coefficient from a coefficient ROM 148 that stores only odd coefficients, depending upon which one of the coefficient addresses COEA, COEB for designating a pair of coefficients is received. The coefficient ROM 148 stores coefficients (C11, C13, C15, . . . , C47) for calculating odd-numbered oversampling points, out of the coefficients Cij (i=1–4, j=0–7) needed for oversampling, as shown in FIG. 17, and supplies the coefficient designated by the read controller 147 to the selector circuits 149, 150.

The selector circuit 149 outputs the even coefficient read from the coefficient ROM 145 to a circuit in the later stage when the selection signal received from the odd/even discrimination block 142 is "0" representing even number, and outputs the odd coefficient read from the coefficient ROM 148 to the circuit in the later stage when the selection signal received is "1" (even number). The selector circuit 150 outputs the odd coefficient read from the coefficient ROM 148 to the circuit in the later stage when the selection signal is even number "0" (even number), and outputs the even coefficient read from the coefficient ROM 145 to the circuit in the later stage when the selection signal is "1" (odd number).

In the arrangement described above, the octuple oversampling/linear interpolation circuit 124 is able to read a pair of coefficients Cij, Ci(j+1) in the first timing (i=1), second timing (i=2), third timing (i=3) and the fourth timing (i=4), at an increased access speed, thus assuring high-speed operations or calculations.

Figure 18A:
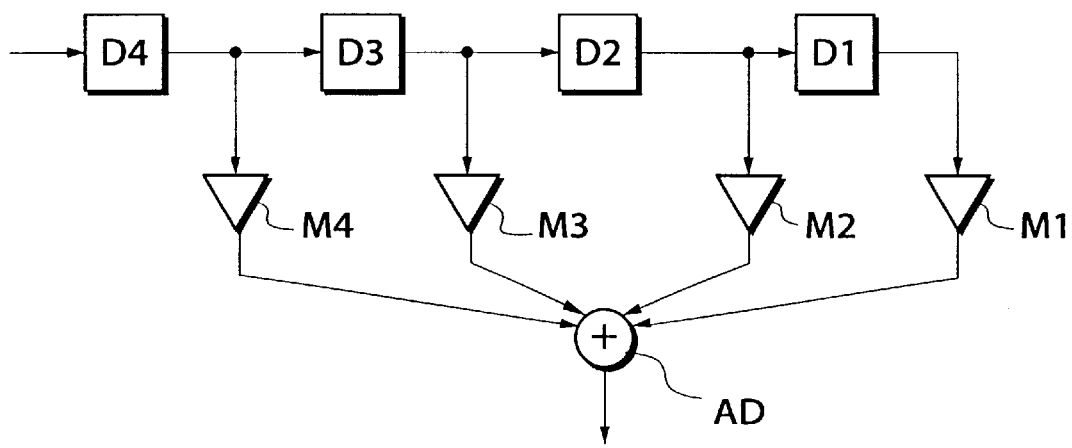
FIG. 18A is a block diagram schematically showing an operating unit of the second embodiment.
Figure 18B:
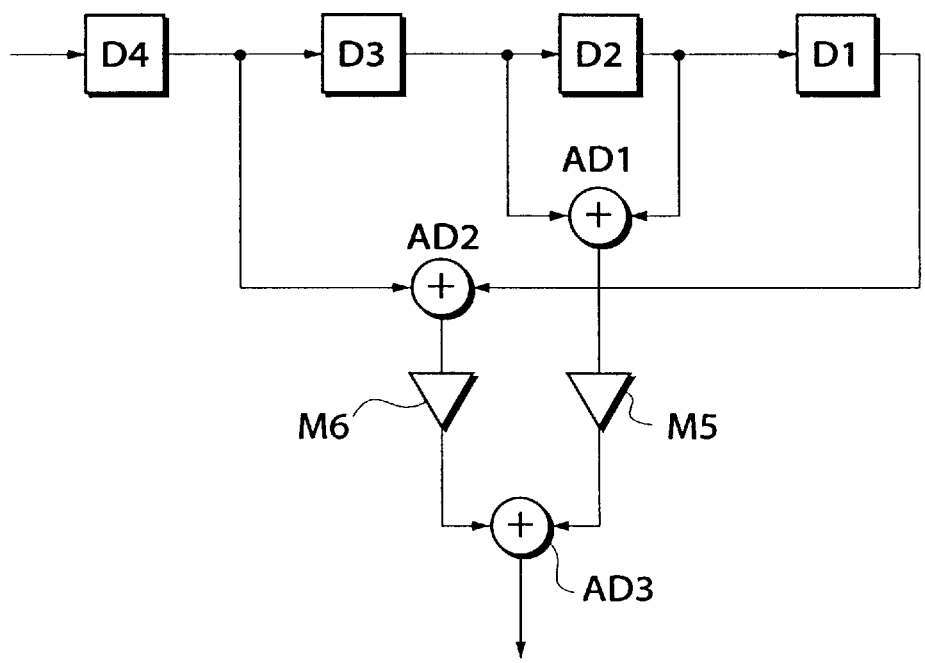
FIG. 18B is a block diagram schematically showing an operating unit of a second variation.
Figure 19:
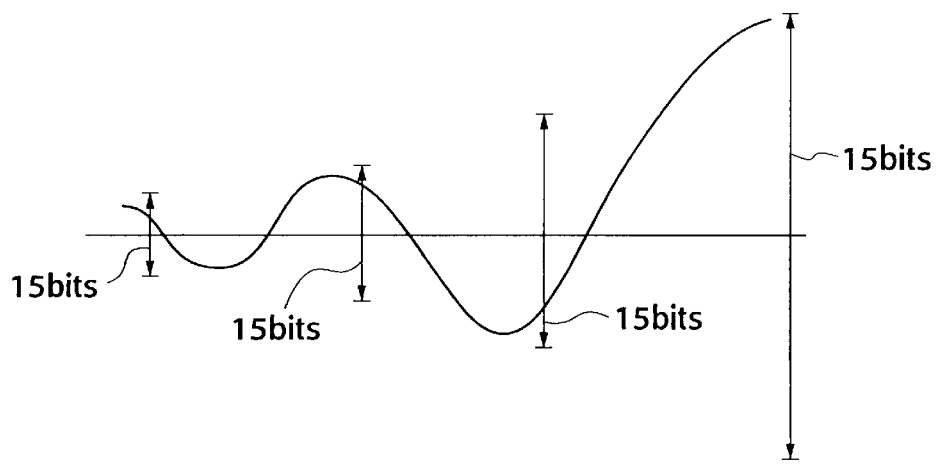
FIG. 19 is a schematic view useful in explaining coefficient compression.

A second variation of the second embodiment will be now described. In the second variation, a coefficient ROM stores only half of the coefficients stored in the coefficient ROM 132 of the second embodiment, which leads to reduction in the storage capacity of the ROM, and an increased operating or calculating speed. FIG. 18A schematically shows the construction of an operating unit of the second embodiment described above, while FIG. 18B schematically shows the construction of an operating unit of the second variation. In the second embodiment described above, multipliers M1, M2, M3, M4 multiply respective outputs (D1, D2, D3, D4) of four delay circuits, by a corresponding coefficient (interpolation value (Ci(j+1)+a{a(Cij−Ci(j+1)})), and an adder AD adds the results of multiplication together, and generates the result of addition, as shown in FIG. 18A. In the second variation, attention is given to the symmetry of coefficients, namely, M1=M4, M2=M3, and an adder AD1 adds data D2 and data D3, while an adder AD2 adds data D1 and data D4, as shown in FIG. 18B. Then, multipliers M5, M6 multiply the respective results of addition by the above-indicated interpolation value, and an adder AD3 adds the results of multiplication from the multipliers M5, M6, and outputs the result of addition. Thus, in the second variation, only the multipliers M5, M6 perform multiplication with the relevant coefficient (interpolation value), and therefore the coefficient ROM is only required to store half of the coefficients that are stored in the ROM of the second embodiment. Consequently, the storage capacity of the coefficient ROM can be reduced, and the operation speed can be increased.

A third variation of the second embodiment will be now explained. In the third variation, coefficients stored in a coefficient ROM are "compressed" so that a limited storage capacity can be utilized with high efficiency. More specifically, the coefficient values used for linear interpolation are compressed by a power of 2, and stored in the coefficient ROM. The coefficients thus compressed are eventually decompressed by performing shift control in an actual convolution operation.

Figure 20:
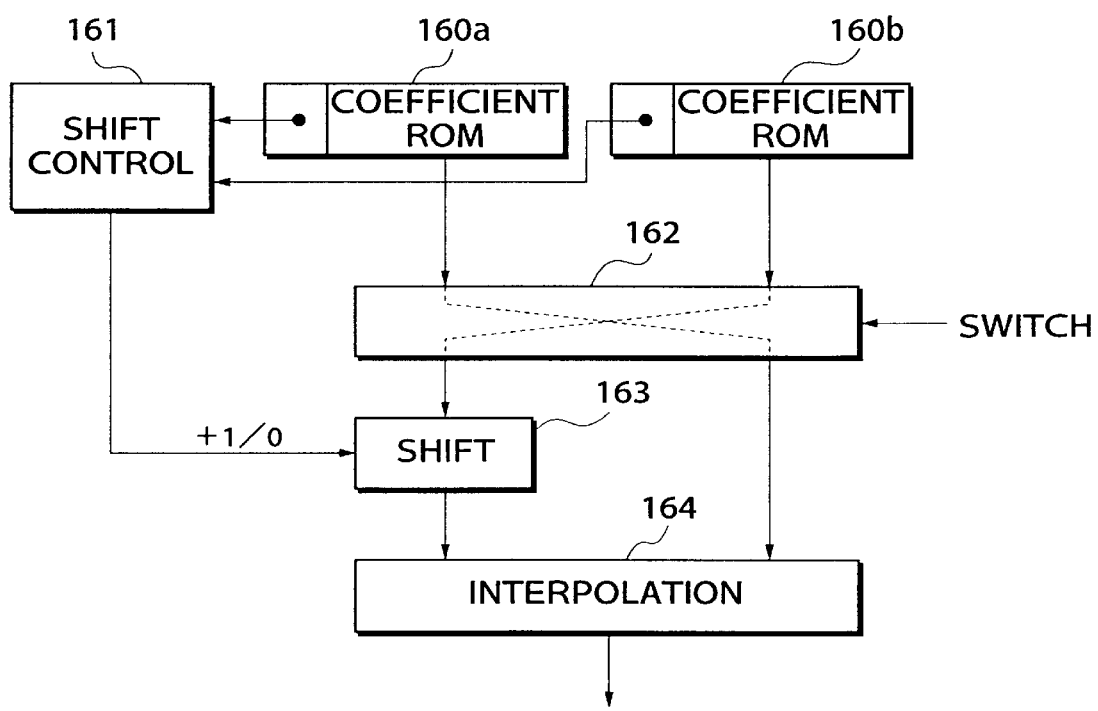
FIG. 20 is a block diagram showing the construction (linear interpolation block) of a third variation.

FIG. 20 shows the construction of a coefficient linear interpolation circuit of a sampling frequency conversion apparatus according to the third variation. In FIG. 20, a coefficient ROM 160a stores information related to shift, and even-numbered coefficients (C10, C12, C14, ..., C46) selected from coefficients Cij (i=1–4, j=0–7) needed for oversampling. A coefficient ROM 160b stores information related to shift, and odd-numbered coefficients (C11, C13, C15, ..., C47) selected from the coefficients Cij (i=1–4, j=0–7) needed for oversampling. A shift controller 161 supplies a shift control signal C1 (+1/0) to a shift register 163, according to the shift related information supplied from the coefficient ROMs 160a, 160b. A switching block 162 switches between coefficients supplied from the respective coefficient ROMs 160a, 160b, and supplies them to the shift register 163 and the interpolation circuit 164, respectively. The shift register 163 shifts the coefficient thus received, according to the shift control signal C1 described above, so as to adjust the scale of coefficients to be interpolated, and supplies the shifted coefficient to an interpolation circuit 164. The interpolation circuit 164 has a construction corresponding to the elements 133 to 135 in FIG. 14 and performs linear interpolation between the coefficients, based on the coefficients supplied thereto and interpolation ratio a.

Figure 21:
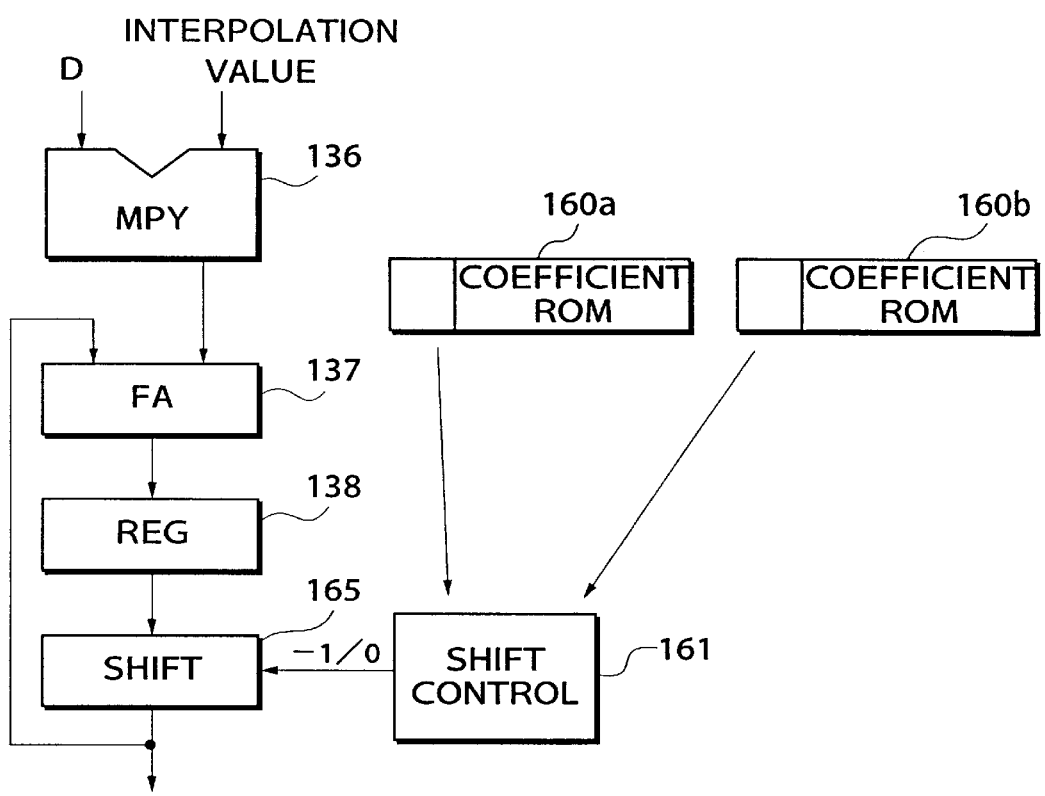
FIG. 21 is a block diagram showing the construction (convolution operating unit) of the third variation.

FIG. 21 shows the construction of a convolution operating unit of the sampling frequency converter of the third variation. In FIG. 21, the same reference numerals as used in FIG. 14 are used for identifying corresponding components. In FIG. 21, a shift register 165 located at the last stage of the convolution operating unit serves to shift data according to a shift control signal C2 (−1/0) supplied from the shift controller 161, and outputs the resulting data. In the convolution, operations are performed from the opposite sides (from the side on which the coefficient value is smaller), and therefore the frequency of shift-down is increased toward the opposite sides, which results in decompression of the coefficients.

In the third variation, the coefficients used for linear interpolation are compressed and then stored in the coefficient ROM, and therefore a limited storage capacity can be utilized with high efficiency.

While each of the first through third variations may be individually combined with the embodiment as shown in FIG. 14, it is also possible to combine all of the variations with the embodiment.

What is claimed is:

1. An asynchronous signal input apparatus comprising:
    a memory device which writes data that are input at a predetermined frequency, in response to a write signal, and reads data in response to a read signal;
    a data quantity measuring device which measures a data quantity representing a quantity of data stored in the memory device; and
    a read signal generating device which generates the read signal at a frequency that varies depending upon the data quantity measured by said data quantity measuring device,
    wherein said read signal generating device includes a converter which performs non-linear conversion on the data quantity measured by said data quantity measuring device, so as to give a non-linear gain to said data quantity, said read signal generating device generating the read signal at a frequency that varies depending upon the data quantity to which the non-linear gain is given by said converter.

2. An asynchronous signal input apparatus according to claim 1, wherein the non-linear gain is determined such that the frequency at which the read signal is generated is kept at a predetermined level when the data quantity is equal to an appropriate value, and the frequency is corrected by an amount of correction which increases non-linearly as a difference between the data quantity and the appropriate value increases, in a direction in which the data quantity becomes equal to the appropriate value.

3. A sampling frequency conversion apparatus comprising:
    a memory device which writes data that are input at a predetermined frequency, in response to a write signal, and reads data in response to a read signal;
    a data quantity measuring device which measures a data quantity representing a quantity of data stored in the memory device;
    a read signal generating device which generates the read signal at a frequency that varies depending upon the data quantity measured by said data quantity measuring device, said read signal generating device including a converter which performs non-linear conversion on the data quantity measured by said data quantity measuring device;
    an interpolation information producing device which produces interpolation information to be used for data generated from said memory device, based on the data quantity to which the non-linear gain is given by said converter; and
    an interpolation device which interpolates data that are read from the memory device in response to the read signal generated by said read signal generating device, based on the interpolation information produced by said interpolation information producing device.

4. A sampling frequency conversion apparatus according to claim 3, wherein said interpolation information producing device interpolates the data read from the memory device in response to the read signal, upon each occurrence of a predetermined sampling signal, such that when the read signal is generated upon occurrence of the sampling signal, interpolation of data that is newly read from the memory device is performed based on the data newly read and the interpolation information, and when the read signal is not generated upon occurrence of the sampling signal, interpolation of data previously read from the memory device upon previous occurrence of the read signal is performed based on the data previously read and the interpolation information.

5. A sampling frequency conversion apparatus comprising:

a first interpolation ratio producing device which produces a first interpolation ratio used for obtaining an interpolation point between input data received in response to a first clock;

a coefficient producing device which produces a pair of coefficients for obtaining a pair of oversampling points, based on the first interpolation ratio;

a second interpolation ratio producing device which produces a second interpolation ratio at an interpolation point between the pair of oversampling points, based on the first interpolation ratio;

an interpolation device which performs linear interpolation on the pair of coefficients produced by said coefficient producing device, so as to obtain a value of the interpolation point between the pair of oversampling points, based on the second interpolation ratio produced by said second interpolation ratio producing device; and an operation device which performs convolution of the value of the interpolation point obtained through linear interpolation by said interpolation device and said input data, in response to a second clock, and generates a result of the convolution as output data.

6. A sampling frequency conversion apparatus according to claim 5, wherein said coefficient producing device includes a memory device which stores a plurality of pairs of coefficients corresponding to the first interpolation ratio.

7. A sampling frequency conversion apparatus according to claim 6, wherein said coefficient producing device obtains a first coefficient address that designates one of said pair of coefficients based on the first interpolation ratio, and obtains a second coefficient address by adding a predetermined integer to the first coefficient address, said coefficient producing device reading the pair of coefficients from said memory device, based on the obtained first coefficient address and second coefficient address.

8. A sampling frequency conversion apparatus according to claim 5, wherein said coefficient producing device comprises:

a first memory device which stores coefficients for calculating even-numbered oversampling points, out of a plurality of pairs of coefficients each of which provide said pair of coefficients; and a second memory device which stores coefficients for calculating odd-numbered oversampling points, out of the plurality of pairs of coefficients, wherein the pair of coefficients are read from the first memory device and the second memory device, based on the first interpolation ratio.

9. A sampling frequency conversion apparatus according to claim 5, wherein said operation device includes a plurality of delay devices that delay the input data by different delay amounts to output a plurality of delay data, respectively, a plurality of multipliers of the same number as the delay devices, which multiply the plurality of delay data by the value of the interpolation point obtained through linear interpolation by said interpolation device, and an adder which adds results of multiplication generated from the multipliers.

10. A sampling frequency conversion apparatus according to claim 5, wherein said operation device includes a plurality of delay devices that delay the input data by different delay amounts to output a plurality of delay data, respectively, a plurality of first adders which amount to one half of the number of the delay devices, each of the said first adders adding a given pair of delay data selected from said plurality of delay data, a plurality of multipliers which amount to one half of the number of the delay devices, which multiply addition data from said first adders by the value of the interpolation point obtained through linear interpolation by said interpolation device, and a second adder which adds results of multiplication generated from the multipliers.

11. A sampling frequency conversion apparatus according to claim 5, wherein said coefficient producing device includes a memory device which stores a plurality of pairs of coefficients that are compressed by a power of 2.

12. A sampling frequency conversion apparatus according to claim 11, wherein said coefficient producing device comprises:

a first memory device which stores coefficients for calculating even-numbered oversampling points selected from the plurality of pairs of coefficients and compressed by the power of 2;

a second memory device which stores coefficients for calculating odd-numbered oversampling points selected from the plurality of pairs of coefficients and compressed by the power of 2, said sampling frequency conversion apparatus further comprising:

a switching device which switches between a coefficient read from said first memory device and a coefficient read from said second memory device;

a first shift device which shifts one of the coefficient read from the first memory device and the coefficient read from the second memory device; and a second shift device which shifts a result of convolution obtained by said operation device.

* * * * *